(12) United States Patent
Nguyen et al.

(10) Patent No.: US 9,972,528 B2
(45) Date of Patent: May 15, 2018

(54) SEMICONDUCTOR DEVICES

(71) Applicant: Samsung Electronics Co., Ltd., Suwon-si (KR)

(72) Inventors: VietHa Nguyen, Yongin-si (KR); Thomas Oszinda, Hwaseong-si (KR); Jongmin Baek, Seoul (KR); Sanghoon Ahn, Goyang-si (KR); Byunghee Kim, Seoul (KR); Wookyung You, Incheon (KR); Naein Lee, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/374,053

(22) Filed: Dec. 9, 2016

(65) Prior Publication Data
US 2017/0178949 A1 Jun. 22, 2017

(30) Foreign Application Priority Data
Dec. 16, 2015 (KR) .................. 10-2015-0180217

(51) Int. Cl.
*H01L 29/00* (2006.01)
*H01L 21/768* (2006.01)
*H01L 23/522* (2006.01)
*H01L 23/532* (2006.01)

(52) U.S. Cl.
CPC .... *H01L 21/7682* (2013.01); *H01L 21/76802* (2013.01); *H01L 21/76843* (2013.01); *H01L 21/76877* (2013.01); *H01L 23/5226* (2013.01); *H01L 23/5329* (2013.01); *H01L 23/53238* (2013.01); *H01L 23/53266* (2013.01)

(58) Field of Classification Search
CPC .......... H01L 23/5226; H01L 23/53238; H01L 23/53266; H01L 21/764; H01L 21/7682
USPC ........................................... 257/522
See application file for complete search history.

(56) References Cited

U.S. PATENT DOCUMENTS

| | | | |
|---|---|---|---|
| 7,071,532 B2 * | 7/2006 | Geffken | H01L 21/76811 257/522 |
| 7,465,676 B2 | 12/2008 | Tsai et al. | |
| 7,553,756 B2 * | 6/2009 | Hayashi | H01L 21/76802 257/522 |
| 7,737,052 B2 | 6/2010 | Bhatia et al. | |
| 8,043,968 B2 | 10/2011 | Cui et al. | |
| 8,536,069 B2 | 9/2013 | Balseanu et al. | |
| 8,803,321 B2 | 8/2014 | Holmes et al. | |
| 8,872,304 B2 * | 10/2014 | Oshida | H01L 21/31116 257/410 |
| 8,993,435 B2 | 3/2015 | Wang et al. | |
| 8,993,442 B2 | 3/2015 | Shih et al. | |
| 9,035,419 B2 * | 5/2015 | Oh | H01L 21/28273 257/410 |
| 9,054,109 B2 | 6/2015 | Lin et al. | |
| 9,257,331 B2 | 2/2016 | Shih et al. | |
| 9,312,222 B2 | 4/2016 | Ting et al. | |
| 2002/0014679 A1 * | 2/2002 | Lee | H01L 21/76802 257/522 |

(Continued)

*Primary Examiner* — Nitin Parekh
(74) *Attorney, Agent, or Firm* — Onello & Mello, LLP

(57) ABSTRACT

A semiconductor device may include a substrate, a first interlayered insulating layer on the substrate having openings, conductive patterns provided in the openings, first to fourth insulating patterns stacked on the substrate provided with the conductive patterns, and a second interlayered insulating layer provided on the fourth insulating pattern.

20 Claims, 14 Drawing Sheets

(56) References Cited

U.S. PATENT DOCUMENTS

| | | | |
|---|---|---|---|
| 2002/0149085 A1* | 10/2002 | Lin | H01L 21/7682 257/522 |
| 2003/0127740 A1* | 7/2003 | Hsu | H01L 21/76811 257/758 |
| 2004/0097065 A1* | 5/2004 | Lur | H01L 21/76807 438/619 |
| 2009/0200636 A1* | 8/2009 | Edelstein | H01L 21/0273 257/522 |
| 2010/0133648 A1* | 6/2010 | Seidel | H01L 21/7682 257/522 |
| 2011/0024907 A1* | 2/2011 | Fujiyama | H01L 21/31053 257/751 |
| 2011/0084357 A1* | 4/2011 | Liu | H01L 21/76807 257/522 |
| 2013/0134549 A1* | 5/2013 | Onishi | H01L 21/764 257/522 |
| 2015/0145134 A1 | 5/2015 | Peng et al. | |

* cited by examiner

SEMICONDUCTOR DEVICES

CROSS-REFERENCE TO RELATED APPLICATIONS

This U.S. non-provisional patent application claims priority under 35 U.S.C. § 119 to Korean Patent Application No. 10-2015-0180217, filed on Dec. 16, 2015, in the Korean Intellectual Property Office, the contents of which are herein incorporated by reference in their entirety.

BACKGROUND

The present inventive concepts relate to a semiconductor device, and, in particular, to a semiconductor device with conductive interconnection lines.

In order to meet an increasing demand for a semiconductor device having small feature size, large capacity, and high density, it is essential to reduce a pitch of a metal line of a semiconductor device. The reduction in pitch of the metal line may lead to an increase in parasitic capacitance of a semiconductor device, and, as a result, the semiconductor device may suffer from deterioration in performance. Accordingly, various studies are being conducted to realize a semiconductor device including low-resistance metal lines and low-k dielectric materials without the technical issues, for example, the increase of the parasitic capacitance.

SUMMARY

Some embodiments of the present inventive concepts provide a highly-reliable semiconductor device.

Some embodiments of the present inventive concepts provide a semiconductor device configured to realize a fast operation speed and a low parasitic capacitance.

According to an aspect of the present inventive concepts, a semiconductor device may include a substrate having a first region and a second region, a first interlayered insulating layer on the substrate defining openings, conductive patterns in the openings defining an air gap on the second region of the substrate, the air gap being defined between the conductive patterns, first to fourth insulating patterns stacked on the first region of the substrate to cover the conductive patterns, and a second interlayered insulating layer on the fourth insulating pattern. The fourth insulating pattern may be extended to include at least a portion covering the conductive patterns on the second region.

According to an aspect of the present inventive concepts, a semiconductor device may include a substrate, an interlayered insulating layer on the substrate defining an opening, a barrier pattern on bottom and side surfaces of the opening, a metal pattern in the opening and on the barrier pattern, the metal pattern including a first portion exposing an inner side surface of the barrier pattern and a second portion having a top surface higher than that of the first portion, and first to fourth insulating patterns stacked on the interlayered insulating layer and the metal pattern. The first insulating pattern may have a bottom surface in contact with the top surfaces of the first and second portions of the metal pattern.

According to an aspect of the present inventive concepts, a semiconductor device may include a substrate, a first interlayered insulating layer on the substrate, conductive patterns in the first interlayered insulating layer defining an air gap therebetween, a first insulating pattern on the first interlayered insulating layer to cover top surfaces of the conductive patterns, a second insulating pattern on the first insulating pattern, a third insulating pattern on the second insulating pattern, a fourth insulating pattern on the third insulating pattern, and a second interlayered insulating layer on the fourth insulating pattern. The first to fourth insulating patterns may be between the conductive patterns and between the first interlayered insulating layer and the air gap.

According to an aspect of the present inventive concepts, a semiconductor device, includes a substrate having a first region and a second region, a first interlayered insulating layer on the substrate, openings in the first interlayered insulating layer in the first and second regions, conductive patterns in the openings, an air gap between the conductive patterns in the second region, first to fourth insulating patterns on the first region of the substrate to cover the first interlayered insulating layer and the conductive patterns, at least one of the first to fourth insulating patterns covering the first interlayered insulating layer and the conductive patterns in the second region, and a second interlayered insulating layer on the fourth insulating pattern.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION

Figure 1:
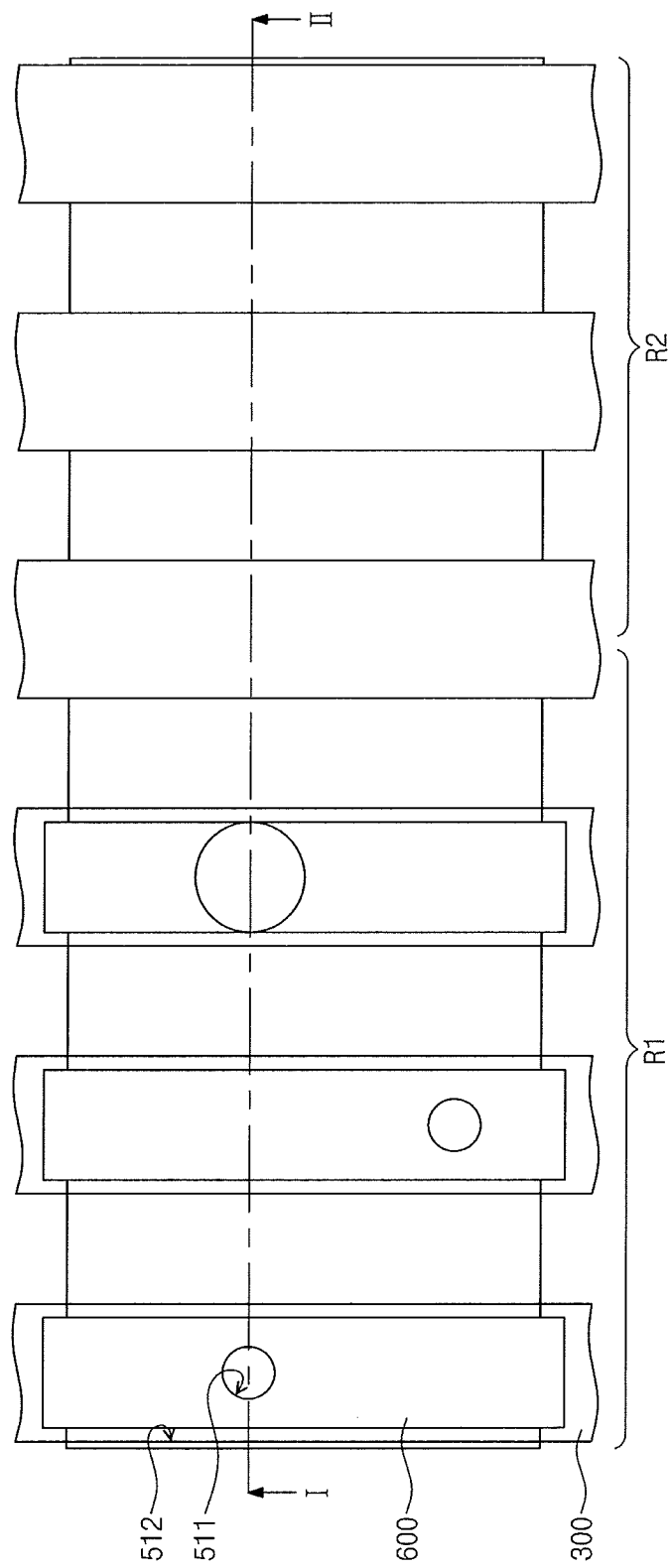
FIG. 1 is a plan view of a semiconductor device according to some embodiments of the inventive concepts.
Figure 2:
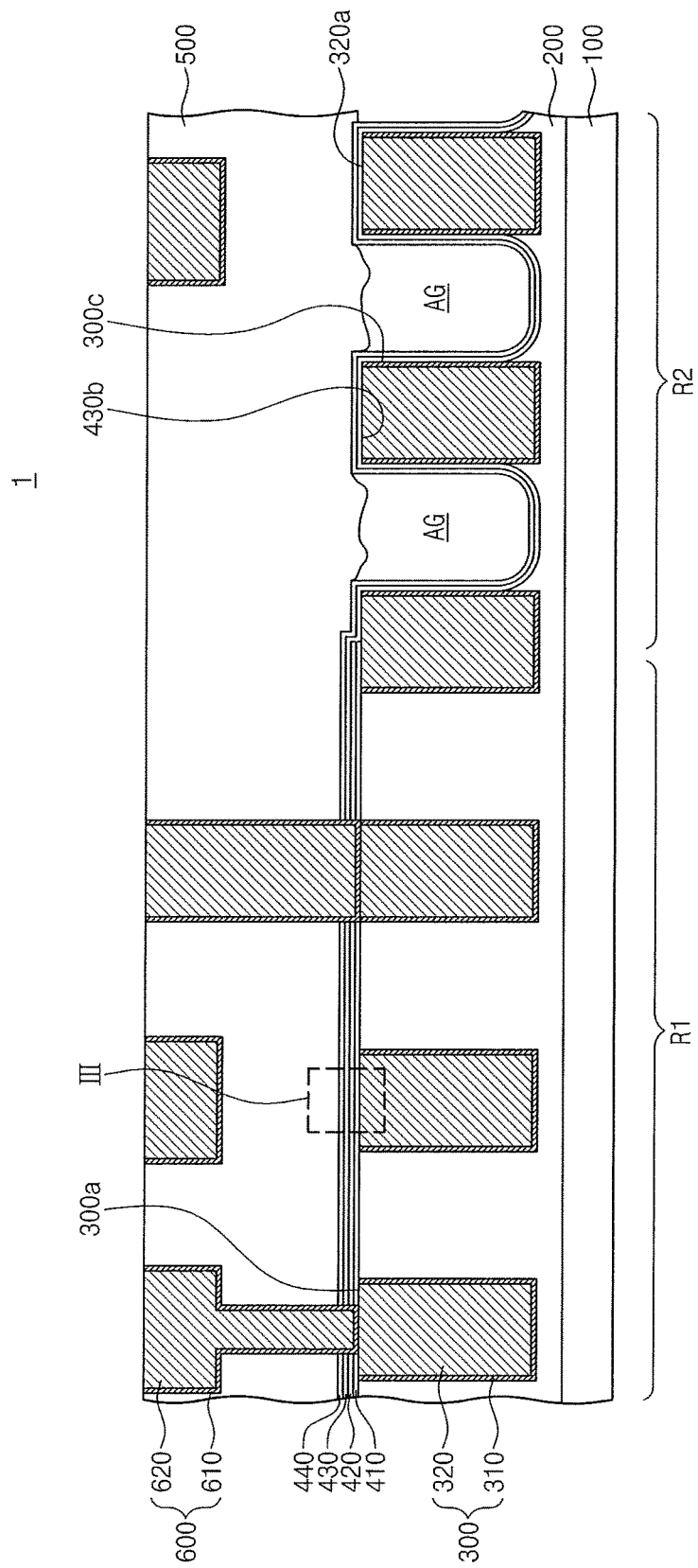
FIG. 2 is a cross-sectional view taken along line I-II of FIG. 1.

FIG. 1 is a plan view of a semiconductor device 1 according to some embodiments of the inventive concepts. FIG. 2 is a cross-sectional view taken along line I-II of FIG. 1.

Referring to FIGS. 1 and 2, the semiconductor device 1 may include a substrate 100. The substrate 100 may include, for example, a first region R1 and a second region R2. The substrate 100 may be a semiconductor substrate, for example, a silicon (Si) wafer, a germanium (Ge) wafer, a silicon-germanium (SiGe) wafer, or the like. An integrated circuit (not shown) including transistors and/or memory cells may be provided in the substrate 100.

A first interlayered insulating layer 200 may be provided on the substrate 100. The first interlayered insulating layer

200 may be an inter-metal dielectric layer. The first interlayered insulating layer 200 may be formed of or include, for example, at least one of silicon oxide, silicon nitride, or silicon oxynitride; however, the inventive concepts are not limited thereto. The first interlayered insulating layer 200 may have, for example, a dielectric constant of about 2-3.

First conductive patterns 300 may be provided in the first interlayered insulating layer 200. Each of the first conductive patterns 300 may include a first barrier pattern 310 and a first metal pattern 320. The first metal pattern 320 may be formed of or include, for example, at least one of copper or tungsten. The first barrier pattern 310 may be provided to cover bottom and side surfaces of the first metal pattern 320. The first barrier pattern 310 may be formed of or include, for example, at least one of tantalum (Ta), tantalum nitride (TaN), titanium (Ti), titanium nitride (TiN), cobalt (Co), or ruthenium (Ru). The first conductive pattern 300 may be connected to the transistor or the integrated circuit (not shown) in the substrate 100 through a contact plug (not shown). The first conductive patterns 300 may extend in a substantially vertical direction of extension relative to a substantially horizontal direction of extension of the first interlayered insulating layer 200 through the first interlayered insulating layer 200. The first conductive patterns 300 may extend from a top surface of the first interlayered insulating layer 200 towards the substrate 100 without extending to the bottom of the first interlayered insulating layer 200. That is, the bottom of the first conductive patterns 300 are spaced apart in a substantially vertical direction from the bottom the first interlayered insulating layer 200.

An air gap AG may be provided in the first interlayered insulating layer 200 of the second region R2 of the substrate 100 and between the first conductive patterns 300 of the second region R2. At least a portion of the air gap AG may be filled with the air whose dielectric constant is lower, for example, about 1.0006, than that of the first interlayered insulating layer 200. The air gap AG may extend in a substantially vertical direction of extension relative to a substantially horizontal direction of extension of the first interlayered insulating layer 200 through the first interlayered insulating layer 200. The air gap AG may extend from a top surface of the first interlayered insulating layer 200 towards the substrate 100 without extending to the bottom of the first interlayered insulating layer 200. That is, the bottom of the air gap AG is spaced apart in a substantially vertical direction from the bottom the first interlayered insulating layer 200. The air gap AG may result in a reduction in parasitic capacitance between the first conductive patterns 300 in the second region R2 and consequently improve reliability of the semiconductor device 1.

First to fourth insulating patterns 410, 420, 430, and 440 may be provided on the first interlayered insulating layer 200 and the first conductive patterns 300. The first insulating pattern 410 may be provided on the first region R1 of the substrate 100 to cover top surfaces 300a of the first conductive patterns 300 in the first region R1. The first insulating pattern 410 may be formed of or include, for example, a nitrogen-containing but substantially oxygen-free insulating material. According to the present inventive concepts, the term "oxygen-free" may be used to express that there is substantially no oxygen in a material or oxygen is intentionally removed in a process of forming a material. For example, the first insulating pattern 410 may be formed of or include, for example, at least one of aluminum nitride, silicon nitride, or silicon carbonitride.

The second insulating pattern 420 may be disposed on the first insulating pattern 410. The second insulating pattern 420 may be formed of or include, for example, a material different from the first insulating pattern 410, and, thus, an interface may be formed between the first insulating pattern 410 and the second insulating pattern 420. The second insulating pattern 420 may have a low dielectric constant, for example, of about 4-5. For example, the second insulating pattern 420 may be formed of or include at least one of silicon carbonitride (SiCN) and/or oxygen doped silicon carbide (SiCO).

The third insulating pattern 430 may be provided on the first region R1 of the substrate 100 to cover the second insulating pattern 420. The third insulating pattern 430 may be extended to the second region R2 of the substrate 100 to cover the first interlayered insulating layer 200 and the first conductive patterns 300 of the second region R2. The third insulating pattern 430 may be provided to cover top and side surfaces of the first conductive patterns 300. The third insulating pattern 430 may be provided between the air gap AG and the first conductive patterns 300 adjacent thereto and between the first interlayered insulating layer 200 and the air gap AG. That is, the third insulating pattern 430 may contact portions of the first barrier pattern 310 and portions of the first interlayered insulating layer 200 at a bottom portion of air gap AG. In some embodiments, the third insulating pattern 430 may be spaced apart from the first barrier pattern 310 at a bottom portion of the first barrier pattern 310 with the first interlayered insulating layer 200 therebetween. The third insulating pattern 430 may extend in a substantially vertical direction of extension relative to a substantially horizontal direction of extension of the substrate 100 in the air gap AG. In some embodiments, the first interlayered insulating layer 200 may include at least a portion interposed between the air gap AG and the first conductive patterns 300. A vertical position of the third insulating pattern 430 may be lower on the second region R2 of the substrate 100 than on the first region R1 of the substrate 100. For example, a bottom surface 430b of the third insulating pattern 430 on the first conductive patterns 300 may be lower on the second region R2 of the substrate 100 than on the first region R1 of the substrate 100 due to the first and second insulating patterns 410 and 420 not being formed in the second region R2. The third insulating pattern 430 may be formed of or include, for example, a material different from the second insulating pattern 420, and, thus, an interface may be formed between the second and third insulating patterns 420 and 430. The third insulating pattern 430 may be formed of or include, for example, a nitrogen-containing but oxygen-free material. For example, the third insulating pattern 430 may be formed of or include at least one of aluminum nitride, silicon nitride, or silicon carbonitride.

The fourth insulating pattern 440 may be provided on the first and second regions R1 and R2 of the substrate 100 to cover the third insulating pattern 430. The fourth insulating pattern 440 may be formed of or include a material different from the third insulating pattern 430, and, thus, an interface may be formed between the third and fourth insulating patterns 430 and 440. The fourth insulating pattern 440 may have a low dielectric constant, for example, of about 4-5. For example, the second insulating pattern 420 may be formed of or include at least one of silicon carbonitride (SiCN) and/or oxygen doped silicon carbide (SiCO). As an example, the third insulating pattern 430 may include the same material as the first insulating pattern 410, and the fourth insulating pattern 440 may include the same material as the second insulating pattern 420; however, the present inventive concepts are not limited thereto.

A second interlayered insulating layer 500 may be disposed on the fourth insulating pattern 440. The second interlayered insulating layer 500 may have, for example, a dielectric constant that is lower than those of the first to fourth insulating patterns 410, 420, 430, and 440. For example, the second interlayered insulating layer 500 may have a dielectric constant of about 2-3. The second interlayered insulating layer 500 may include, for example, the same or similar material as the first interlayered insulating layer 200. The air gap AG may be provided on the second region R2 of the substrate 100 and between the fourth insulating pattern 440 and the second interlayered insulating layer 500. The second interlayered insulating layer 500 may have portions which extend below a top surface of the first interlayered insulating layer 200 in the air gap AG.

A second conductive pattern 600 may be provided on the first and second regions R1 and R2 of the substrate 100 and in the second interlayered insulating layer 500. The second conductive pattern 600 may include, for example, a second barrier pattern 610 and a second metal pattern 620. The second barrier pattern 610 may be formed of or include, for example, at least one of the materials for the first barrier pattern 310. The second metal pattern 620 may be formed of or include, for example, one, for example, copper, of the materials for the first metal pattern 320.

In some embodiments, the second region R2 of the substrate 100 may be omitted.

Figure 3:
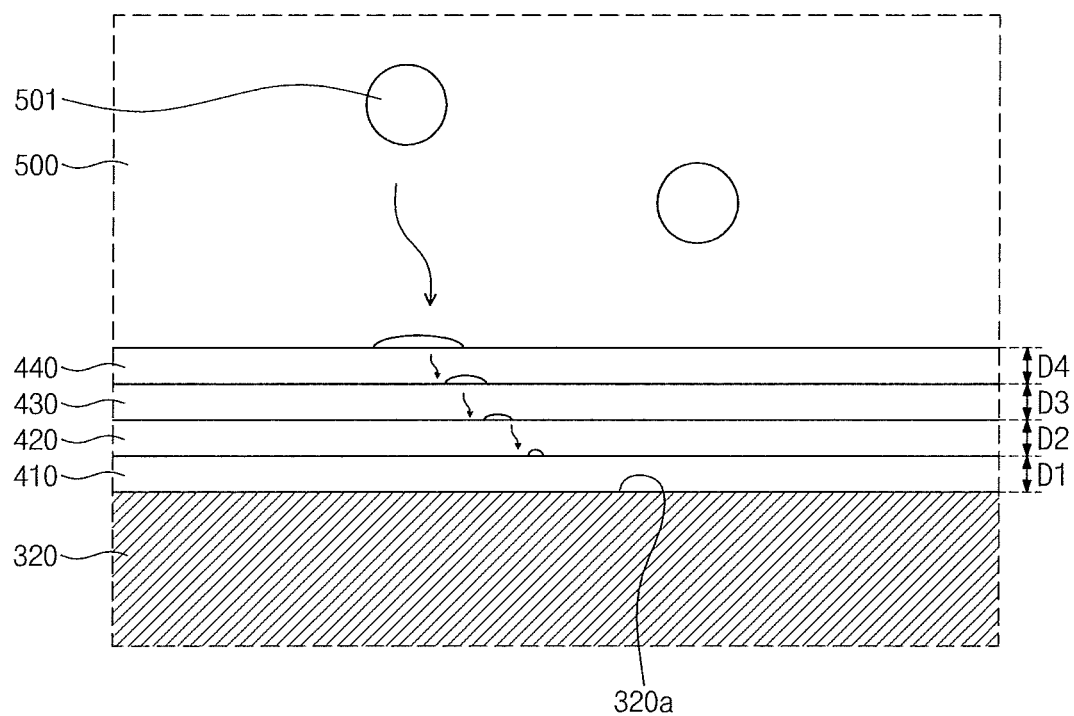
FIG. 3 is an enlarged, cross-sectional view of a portion 'III' of FIG. 2.

FIG. 3 is an enlarged, cross-sectional view of a portion 'III' of FIG. 2. Hereinafter, the insulating patterns will be described in more detail. Although a single first metal pattern 320 will be described with reference to FIG. 3, but the inventive concept is not limited thereto.

Referring to FIG. 3 in conjunction with FIG. 2, water and/or oxygen 501 may be contained in the first and second interlayered insulating layers 200 and 500. For all that, side and bottom surfaces of the first metal pattern 320 may be protected by the first barrier pattern 310. In an embodiment in which the insulating patterns 410, 420, 430, and 440 are not provided, the second interlayered insulating layer 500 may be in contact with a top surface 320a of the first metal pattern 320. A metallic material contained in the first metal pattern 320 may react with the water and/or oxygen 501 contained in the second interlayered insulating layer 500, and this reaction may lead to damage, for example, oxidation, of a top portion of the first metal pattern 320.

In the embodiment of the semiconductor device 1 of FIGS. 1 through 3, the first through fourth insulating patterns 410, 420, 430, and 440 may be interposed between the first metal pattern 320 and the second interlayered insulating layer 500. That is, the first metal pattern 320 is covered with the first insulating pattern 410, and, thus, the first metal pattern 320 may not be in contact with the second interlayered insulating layer 500. Since the first insulating pattern 410 is formed of an oxygen-free material, the first metal pattern 320 may be prevented from being oxidized by the first insulating pattern 410. That is, the first metal pattern 320 may be prevented from being damaged and, consequently, reliability of the semiconductor device 1 may be improved.

An adjacent pair of the first to fourth insulating patterns 410, 420, 430, and 440 may have structures different from each other. That is, the structure of the first insulating pattern 410 may be different than the structure of the second insulating pattern 420, the structure of the second insulating pattern 420 may be different than the structure of the third insulating pattern 430, and the structure of the third insulating pattern 430 may be different than the structure of the fourth insulating pattern 440. Further, structures of interfaces between the first to fourth insulating patterns 410, 420, 430, and 440 may be different from structures of the first to fourth insulating patterns 410, 420, 430, and 440. For example, an atomic bonding structure at an interface between the third and fourth insulating patterns 430 and 440 may be different from an atomic bonding structure in each of the third and fourth insulating patterns 430 and 440. As illustrated by arrows in FIG. 3, there may be a difference in a penetration path of the water and/or oxygen 501 between the first to fourth insulating patterns 410, 420, 430, and 440. The penetration of the water and/or oxygen 501 may be more difficult at the interface between the third and fourth insulating patterns 430 and 440 than in the fourth insulating pattern 440. Accordingly, a part of the water and/or oxygen 501 may remain between the third and fourth insulating patterns 430 and 440. Similarly, a part of the water and/or oxygen 501 may remain between the first and second insulating patterns 410 and 420, between the second and third insulating patterns 420 and 430 and between the fourth insulating pattern 440 and the second interlayered insulating layer 500. In an embodiment in which the number of the first to fourth insulating patterns 410, 420, 430, and 440 and the interfaces therebetween is increased, it is possible to more effectively prevent the first metal pattern 320 from being oxidized. In some embodiments, at least four insulating patterns, for example first to fourth insulating patterns, 410, 420, 430, and 440, may be provided to prevent the first metal pattern 320 from being oxidized.

In the embodiment in which the second to fourth insulating patterns 420, 430, and 440 are omitted, the first insulating pattern 410 may have a relatively large thickness. For example, in such an embodiment, the first insulating pattern 410 may have a thickness of about 125 Å or thicker. In the embodiment in which a thickness D1 of the first insulating pattern 410 is smaller than 125 Å, oxidation of the first metal pattern 320 which may be caused by the second interlayered insulating layer 500 may be difficult to prevent. In some embodiments, since the second to fourth insulating patterns 420, 430, and 440 are additionally formed on the first insulating pattern 410 having thicknesses D2, D3 and D4, respectively, a thickness D1, D2, D3 and D4 of each of the first to fourth insulating patterns 410, 420, 430, and 440, respectively, may be reduced. Thus, the first to fourth insulating patterns 410, 420, 430, and 440 may be formed to have a total thickness, that is, a sum of the thicknesses D1, D2, D3, and D4, that is smaller than the thickness D1 of the first insulating pattern 410, on which the second to fourth insulating patterns 420, 430, and 440 are not provided. For example, the first to fourth insulating patterns 410, 420, 430, and 440 may be provided in such a way that the sum of the thicknesses D1, D2, D3, and D4 thereof ranges from about 1 Å to about 60 Å, in particular, from 1 Å to 45 Å. The first to fourth insulating patterns 410, 420, 430, and 440 may have dielectric constants, for example, higher than that of the second interlayered insulating layer 500. The reduction in the total thickness of the first to fourth insulating patterns 410, 420, 430, and 440 may result in a reduction in parasitic capacitance between the first and second conductive patterns 300 and 600. In some embodiments, at least one of the second to fourth insulating patterns 420, 430, and 440 may have a relatively low dielectric constant, which may result in further reduction of parasitic capacitance between the first and second conductive patterns 300 and 600. As a result, the semiconductor device 1 may have improved electric characteristics, for example, RC delay and reliability.

Referring to FIG. 2, the third insulating pattern 430 may be in direct contact with the top surface 320a of the first metal pattern 320, on the second region R2 of the substrate 100. The third insulating pattern 430 may be formed of an oxygen-free material, and, thus, the first metal pattern 320 may be prevented from being oxidized. The fourth insulating pattern 440 may be formed of or include, for example, a material different from the third insulating pattern 430, and, thus, an interface may be formed between the third and fourth insulating patterns 430 and 440. Water and/or oxygen contained in the second interlayered insulating layer 500 may remain between the third and fourth insulating patterns 430 and 440 and between the fourth insulating pattern 440 and the second interlayered insulating layer 500 in a similar manner to FIG. 3. The third and fourth insulating patterns 430 and 440 may be configured to prevent the first metal pattern 320 on the second region R2 of the substrate 100 from being oxidized.

Hereinafter, a method of fabricating a semiconductor device will be described with reference to FIGS. 4A to 4H.

FIGS. 4A, 4B, and 4D to 4H are cross-sectional views, which are taken along line I-II of FIG. 1 to illustrate a method of fabricating a semiconductor device, according to some embodiments of the inventive concepts. FIG. 4C is an enlarged, cross-sectional view of a portion 'IV' of FIG. 4B.

Figure 4A:
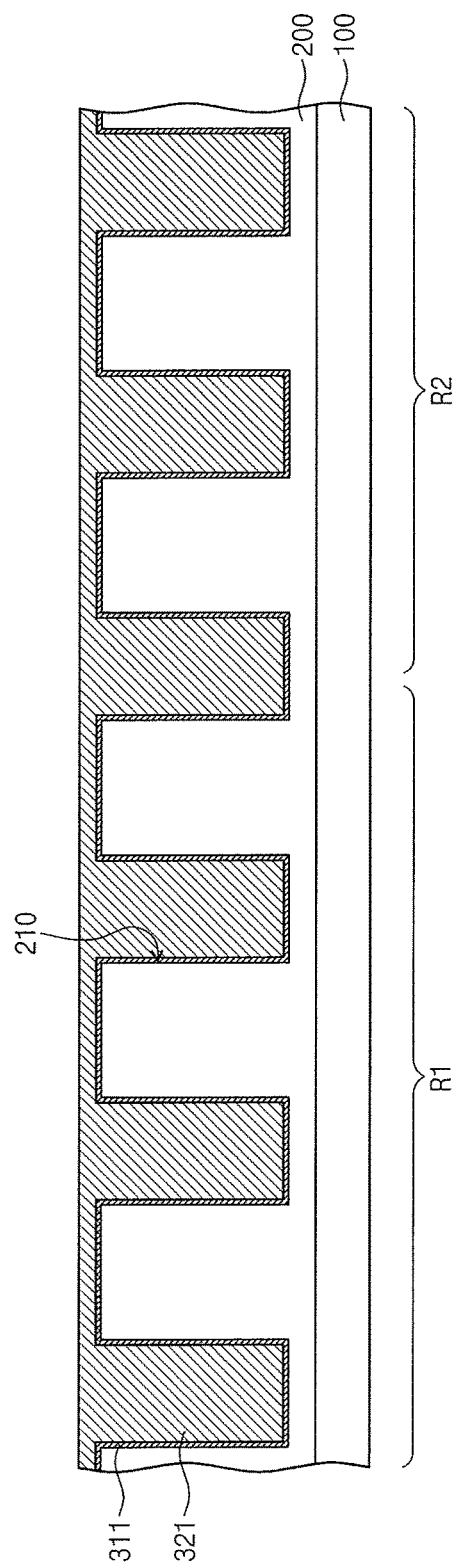
FIGS. 4A, 4B, and 4D to 4H are cross-sectional views illustrating a method of fabricating a semiconductor device, according to some embodiments of the inventive concepts.

Referring to FIG. 4A, the first interlayered insulating layer 200 with first openings 210 may be formed on the substrate 100 having first openings 210. By performing an etching process on the first interlayered insulating layer 200, the first openings 210 may be formed in the first interlayered insulating layer 200. The first openings 210 may extend in a substantially vertical direction of extension relative to a substantially horizontal direction of extension of the first interlayered insulating layer 200. The first openings 210 may extend from a top of the first interlayered insulating layer 200 towards a bottom of the first interlayered insulating layer 200 without extending to the bottom of the first interlayered insulating layer 200. A barrier layer 311 may be formed to conformally cover the first interlayered insulating layer 200 including the first interlayered insulating layer 200 within the first openings 210. For example, the barrier layer 311 may be formed to cover bottom and side surfaces of the first openings 210 and the top surface of the first interlayered insulating layer 200. The barrier layer 311 may be formed of or include, for example, at least one of tantalum, tantalum nitride, titanium, titanium nitride, cobalt, or ruthenium. A metal layer 321 may be formed on the top surface of the first interlayered insulating layer 200 to fill the first openings 210. The metal layer 321 may be formed to cover the barrier layer 311. In some embodiments, the metal layer 321 may be formed by, for example, depositing a metal layer, for example, copper, using an electroplating process.

Figure 4B:
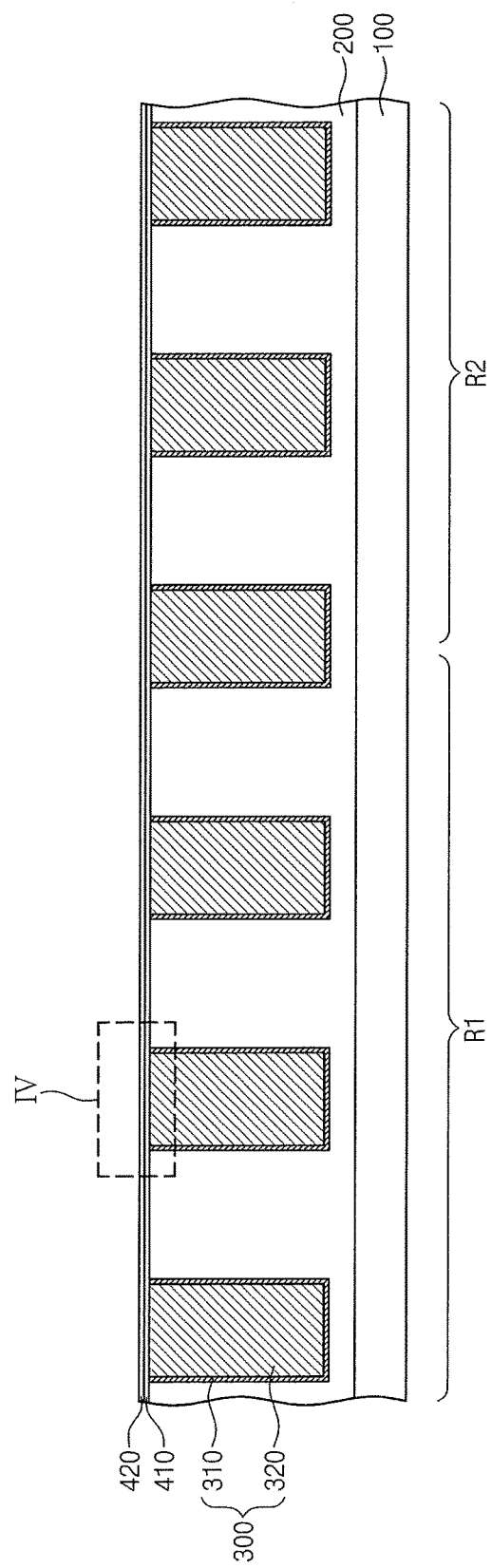
Figure 4C:
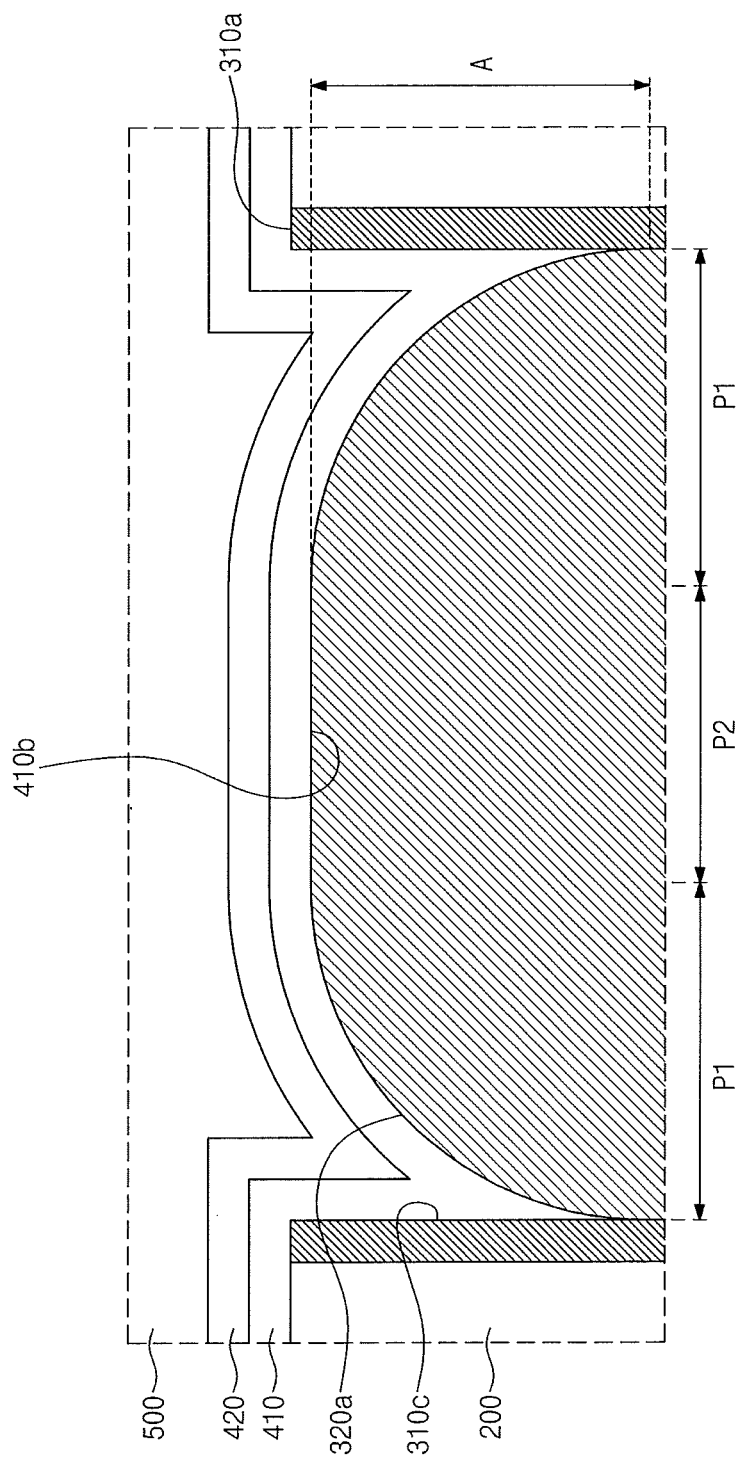
FIG. 4C is an enlarged, cross-sectional view of a portion 'IV' of FIG. 4B.

Referring to FIG. 4B in conjunction with FIG. 4A, a planarization process may be performed on the barrier layer 311 and the metal layer 321, and, as a result, the first barrier pattern 310 and the first metal pattern 320 may be faulted in each of the first openings 210. For example, the planarization process may include performing a chemical mechanical polishing (CMP) process on the barrier layer 311 and the metal layer 321. The planarization process may be performed to expose the top surface of the first interlayered insulating layer 200, and, thus, the first conductive patterns 300 may be locally formed in the first openings 210, respectively. That is, the first barrier patterns 310 and the first metal pattern 320 may be formed only within first openings 210. Each of the first conductive patterns 300 may include the first barrier pattern 310 and the first metal pattern 320.

The first and second insulating patterns 410 and 420 may be formed on the first interlayered insulating layer 200 and the first conductive patterns 300 in the first and second regions R1 and R2. The first and second insulating patterns 410 and 420 may include the same or similar material as that described in connection with FIGS. 1 and 2. The second insulating pattern 420 may be deposited on the first insulating pattern 410. The first and second insulating patterns 410 and 420 may be formed to have an interfacial structure that is different from a structure of each of the first and second insulating patterns 410 and 420. That is, the interface between the first and second insulating patterns 410 and 420 may have a structure different than the structures of the first and second insulating patterns 410 and 420. Hereinafter, the process of forming the first metal pattern 320 and the first insulating pattern 410 will be described in more detail with reference to FIG. 4C.

Referring to FIG. 4C in conjunction with FIGS. 4A and 4B, the first metal pattern 320 may include a first portion P1 and a second portion P2. The first portion P1 may be adjacent to an inner side surface 310c of the first barrier pattern 310, compared with the second portion P2. For example, when viewed in a plan view, the first portion P1 may correspond to an edge portion of the first metal pattern 320, and the second portion P2 may correspond to a center portion of the first metal pattern 320. That is, the first portion P1 may be between the second portion P2 and inner side surface 310c of the first barrier pattern 310. As a result of the Galvanic corrosion in the process of forming the first conductive patterns 300, a polishing rate of the metal layer 321 may be higher at a region adjacent to the barrier layer 311 than at another region apart from the barrier layer 311. Accordingly, the top surface 320a of the first portion P1 of the first metal pattern 320 may be positioned at a lower level than the top surface 320a of the second portion P2 of the first metal pattern 320 and a top surface 310a of the first barrier pattern 310. For example, the maximal height difference A of the top surface 320a between the first and second portions P1 and P2 of the first metal pattern 320 may range from about 1 nm to 10 nm. A space may be formed between the inner side surface 310c and the top surface 320a of the first portion P1. That is, a portion of the inner side surface 310c of the first barrier pattern 310 may be exposed by the first metal pattern 320. The top surface 320a in the second portion P2 may be lower than the top surface 310a of the first barrier pattern 310.

In the embodiment in which the first insulating pattern 410 has a poor step coverage property, a void (not shown) may be formed between the top surface 320a of the first portion P1 of the first metal pattern 320 and a bottom surface 410b of the first insulating pattern 410. In some embodiments, the first insulating pattern 410 may be formed to have a good step coverage property, and, in such an embodiment, the first metal pattern 320 may be hermetically covered with the first insulating pattern 410. For example, the bottom surface 410b of the first insulating pattern 410 may be in direct contact with not only the top surface 320a of the first and second portions P1 and P2 of the first metal pattern 320 but also the inner side surface 310c of the first barrier pattern 310 exposed by the first metal pattern 320. That is, a void may be prevented from being formed between the first metal pattern 320 and the first insulating pattern 410 and reliability of the semiconductor device 1 may be improved.

Figure 4D:
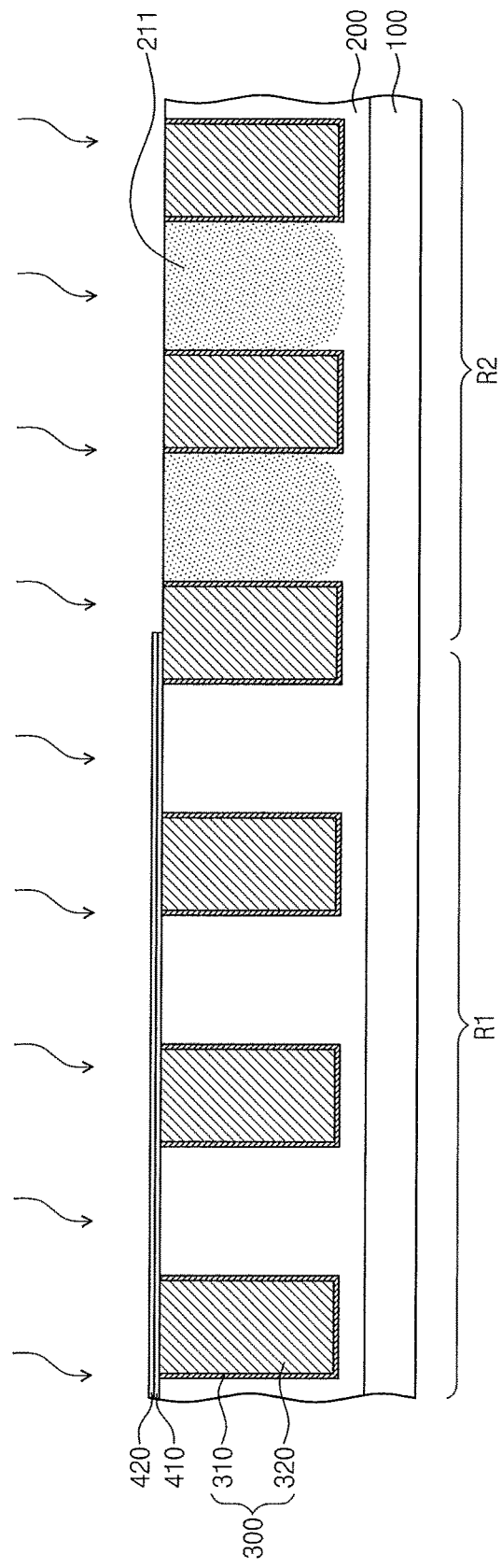

Referring to FIG. 4D, the first and second insulating patterns 410 and 420 may be removed from the second region R2 of the substrate 100, and, thus, the first interlayered insulating layer 200 and the conductive patterns 300 of the second region R2 of the substrate 100 may be exposed. A plasma treatment may be performed on the exposed portion of the first interlayered insulating layer 200, and, as a result, a damaged interlayered insulating layer 211 may be formed on the second region R2 of the substrate 100. The plasma treatment may be performed, for example, at a temperature of 200-400° C. and a pressure of 2-8 Torr. As an example, the first interlayered insulating layer 200 may be formed of or include at least one of silicon carbon oxides ($Si_xC_yO_y$). The plasma treatment may lead to breakage of the silicon carbon oxide bonds contained in the first interlayered insulating layer 200. The second insulating pattern 420 may protect the first interlayered insulating layer 200 against the plasma.

Figure 4E:
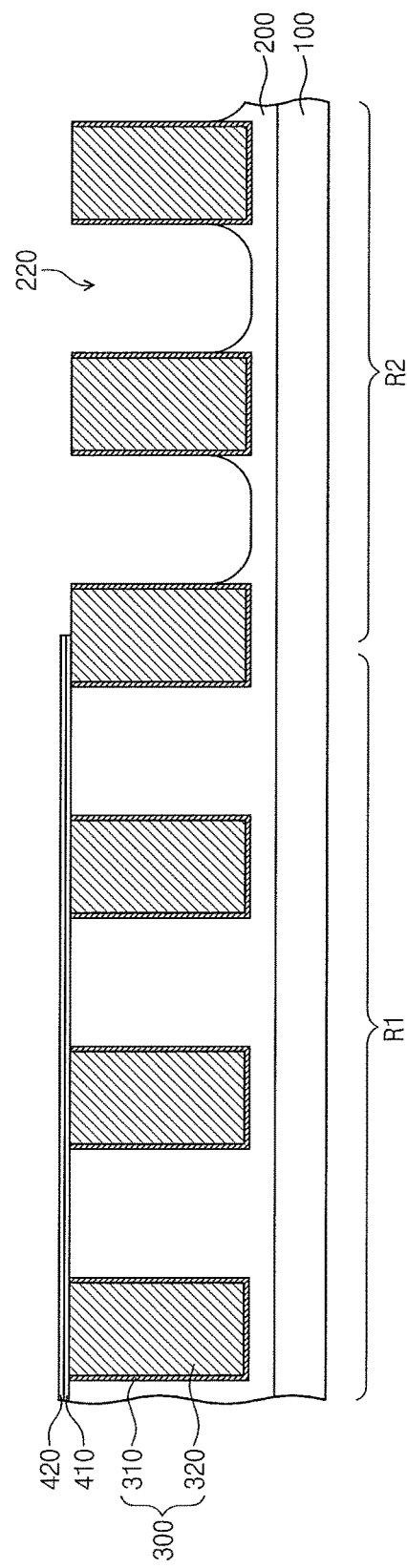

Referring to FIG. 4E, the damaged interlayered insulating layer 211 of FIG. 4D may be removed to form a recess region 220 on the second region R2 of the substrate 100. The recess region 220 may extend in a substantially vertical direction of extension relative to a substantially horizontal direction of extension of the first interlayered insulating layer 200. In an embodiment in which a plurality of first conductive patterns 300 are provided, the recess region 220 may be formed between the first conductive patterns 300. For example, the damaged interlayered insulating layer 211 may be removed by a wet etching process using, for example, hydrofluoric acid (HF); however, a method of removing the damaged interlayered insulating layer 211 is not limited thereto. In some embodiments, at least a portion of the first and second insulating patterns 410 and 420 may not be removed from the first region R1 of the substrate 100. The recess region 220 may expose portions of outer sidewalls of the first barrier pattern 310.

Figure 4F:
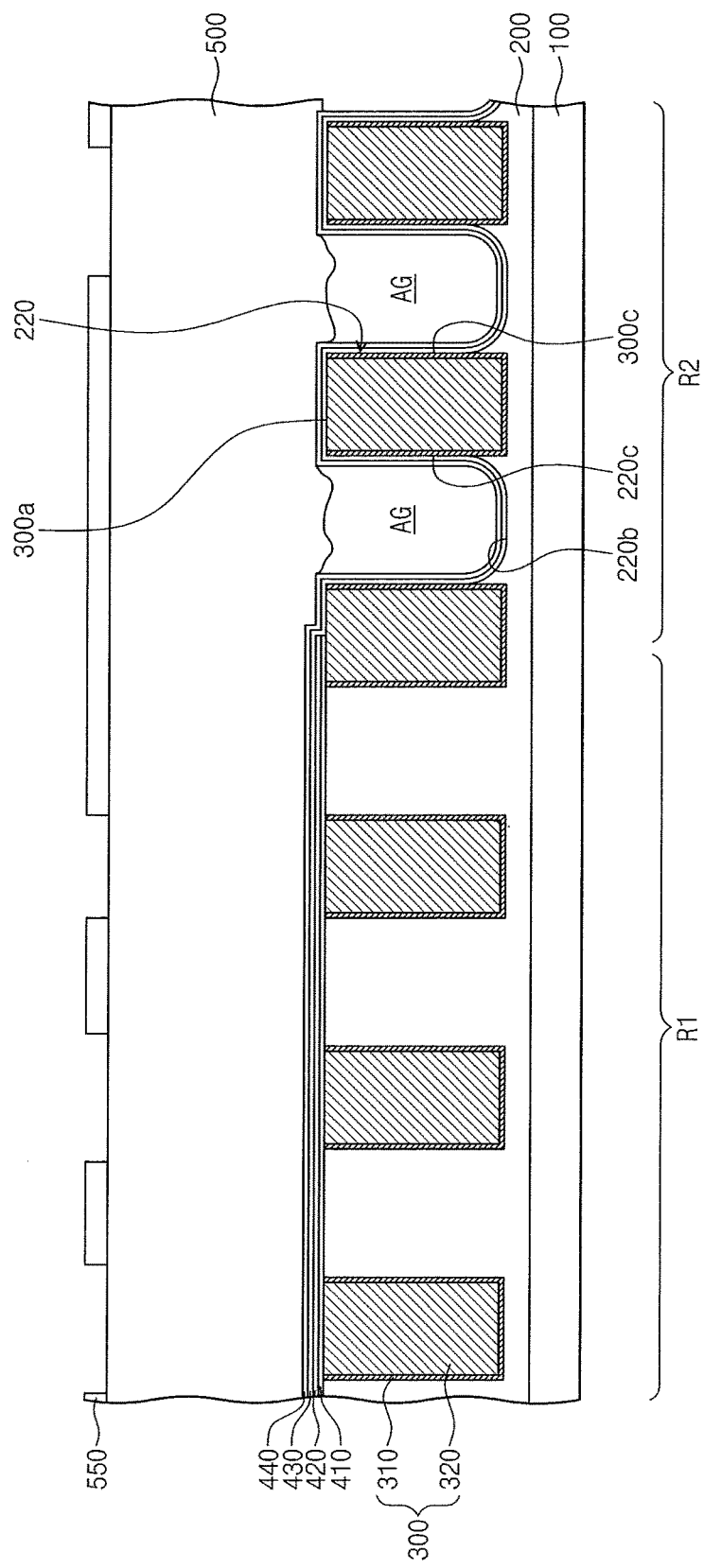

Referring to FIG. 4F, the third insulating pattern 430 may be deposited on the first and second regions R1 and R2 of the substrate 100. The second and third insulating patterns 420 and 430 may be formed to have an interfacial structure that is different from a structure of each of the second and third insulating patterns 420 and 430. That is, the interface between the second and third insulating patterns 420 and 430 may have a structure different than the structures of the second and third insulating patterns 420 and 430. The third insulating pattern 430 may be formed to cover the second insulating pattern 420 on the first region R1 of the substrate 100 and to cover the top surfaces 300a of the first conductive patterns 300 on the second region R2 of the substrate 100 and surfaces of the recess region 220. The third insulating pattern 430 may be formed to have a good step coverage property, thereby including a portion extending into the recess region 220 of the first interlayered insulating layer 200. For example, the third insulating pattern 430 may be formed to cover a bottom surface 220b and a side surface 220c of the recess region 220. On the second region R2 of the substrate 100, the third insulating pattern 430 may be formed to hermetically cover the first metal pattern 320, and, thus, a void may not be formed between the third insulating pattern 430 and the first metal pattern 320. For example, as described with reference to FIG. 4C, the first conductive patterns 300 may include the first portion P1 and the second portion P2. A bottom surface of the third insulating pattern 430 may be in direct contact with not only the top surface 320a of the first and second portions P1 and P2 of the first metal pattern 320 but also the inner side surface 310c of the first barrier pattern 310 exposed by the first metal pattern 320. The fourth insulating pattern 440 may be deposited on the first and second regions R1 and R2 of the substrate 100 to cover the third insulating pattern 430. The third and fourth insulating patterns 430 and 440 may be formed to have an interfacial structure that is different from a structure of each of the third and fourth insulating patterns 430 and 440. That is, the interface between the third and fourth insulating patterns 430 and 440 may have a structure different than the structures of the third and fourth insulating patterns 430 and 440.

The second interlayered insulating layer 500 may be formed on the fourth insulating pattern 440. The second interlayered insulating layer 500 may be formed to have a poor step coverage property, and, thus, a top entrance of the recess region 220 may be sealed by second interlayered insulating layer 500. Accordingly, on the second region R2 of the substrate 100, the air gap AG may be formed between the first conductive patterns 300 and between the fourth insulating pattern 440 and the second interlayered insulating layer 500. A mask pattern 550 may be formed on the second interlayered insulating layer 500. The mask pattern 550 may be formed of or include, for example, at least one of metallic materials, for example, titanium oxide, titanium nitride, and/or tungsten; however, the inventive concepts are not limited thereto.

Figure 4G:
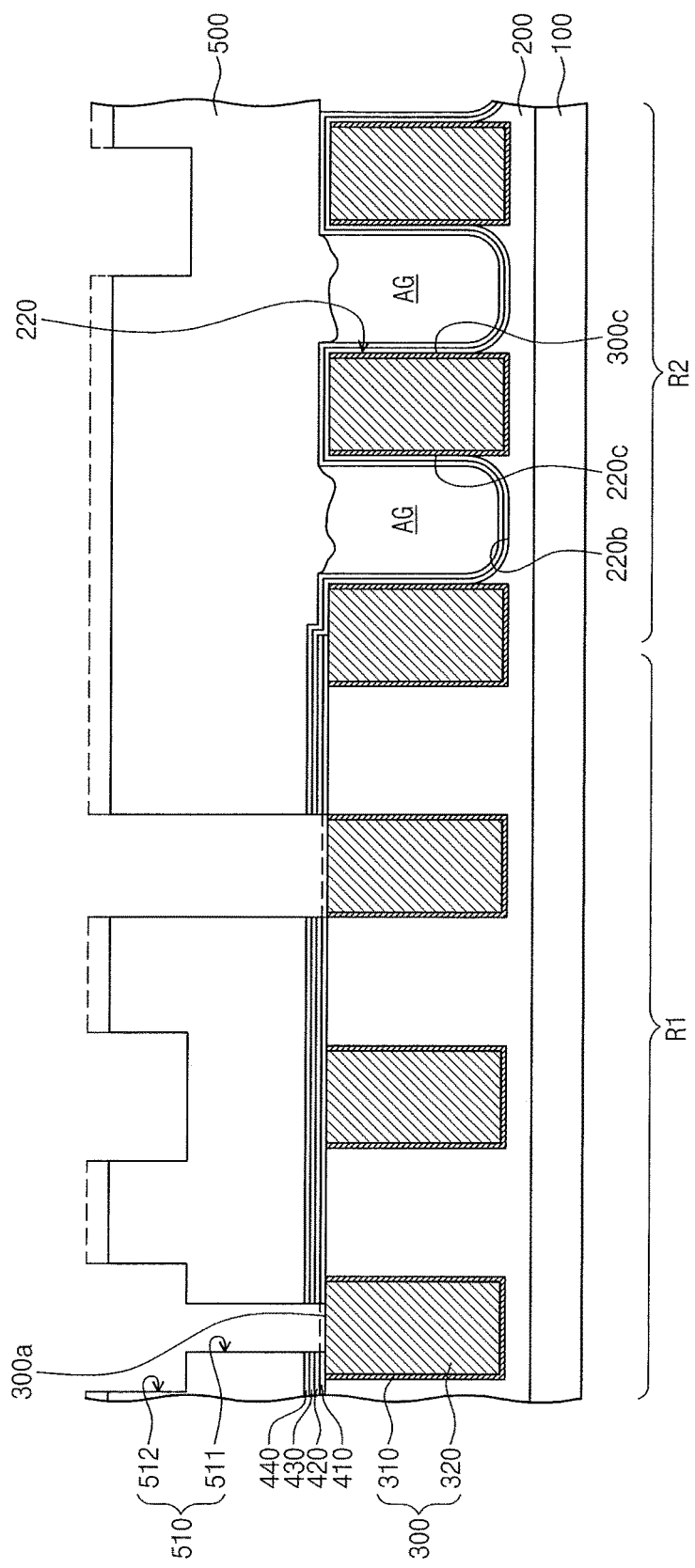

Referring to FIG. 4G in conjunction with FIG. 1, a second opening 510 may be formed in the second interlayered insulating layer 500 by, for example, an etching process using the mask pattern 550. The second opening 510 may be formed by, for example, a dual-damascene process. In some embodiments, the second opening 510 may be formed by a dry etching process; however, the inventive concepts are not limited thereto. The second opening 510 may include a via hole 511 and a trench 512. The via hole 511 and the trench 512 may extend in a substantially vertical direction of extension relative to a substantially horizontal direction of extension of the second interlayered insulating layer 500. The via hole 511 may be formed in a lower portion of the second interlayered insulating layer 500 to expose the first insulating pattern 410. The trench 512 may be formed in an upper portion of the second interlayered insulating layer 500 and may be connected to the via hole 511. At least one of the first to third insulating patterns 410, 420, and 430 may have an etch selectivity with respect to the second interlayered insulating layer 500, when the etching process is performed to form the second opening 510. For example, the first insulating pattern 410 may have an etch selectivity with respect to the second interlayered insulating layer 500, and, thus, at least a portion of the first insulating pattern 410 may not be removed during the etching process. The first insulating pattern 410 may prevent the first conductive patterns 300 from being exposed during the etching process. Accordingly, the first conductive patterns 300 may be prevented from being damaged by the etching process and, consequently, reliability of the semiconductor device 1 may be improved. In some embodiments, the via hole 511 may be formed to expose a top surface of the second insulating pattern 420 or a top surface of the third insulating pattern 430. Thereafter, the mask pattern 550 and the first insulating pattern 410 in the second opening 510 may be removed, and, thus, the top surfaces 300a of the first conductive patterns 300 may be exposed through the second openings 510. For example, the mask pattern 550 and the first insulating pattern 410 may be removed by a wet etching process; however, the inventive concepts are not limited thereto. As a result of the removal of the mask pattern 550, the second opening 510 may have a reduced depth and a reduced aspect ratio.

Figure 4H:
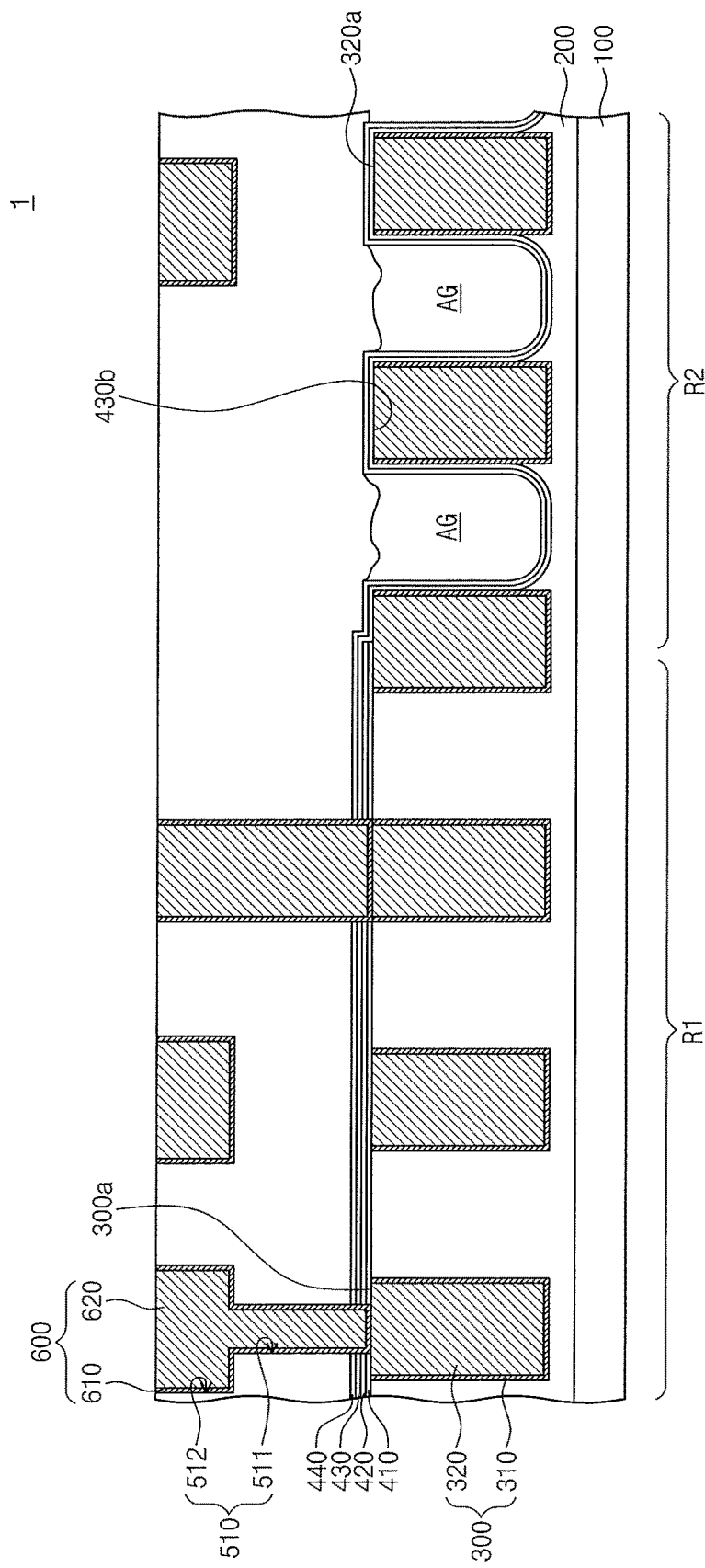

Referring to FIG. 4H, the second conductive pattern 600 may be formed in the second opening 510. The second conductive pattern 600 may extend in a substantially vertical direction of extension relative to a substantially horizontal direction of extension of the second interlayered insulating layer 500. The second conductive pattern 600 may include the second barrier pattern 610 and the second metal pattern 620. A portion of the second conductive pattern 600 in the via hole 511 may serve as a via plug, and a portion of the second conductive pattern 600 in the trench 512 may serve as an interconnection line. Since the second opening 510 has a reduced aspect ratio, difficulty in filling the second opening 510 with the second metal pattern 620 may be reduced. As a result, a void or seam may be prevented from being formed in the second metal pattern 620.

Figure 5:
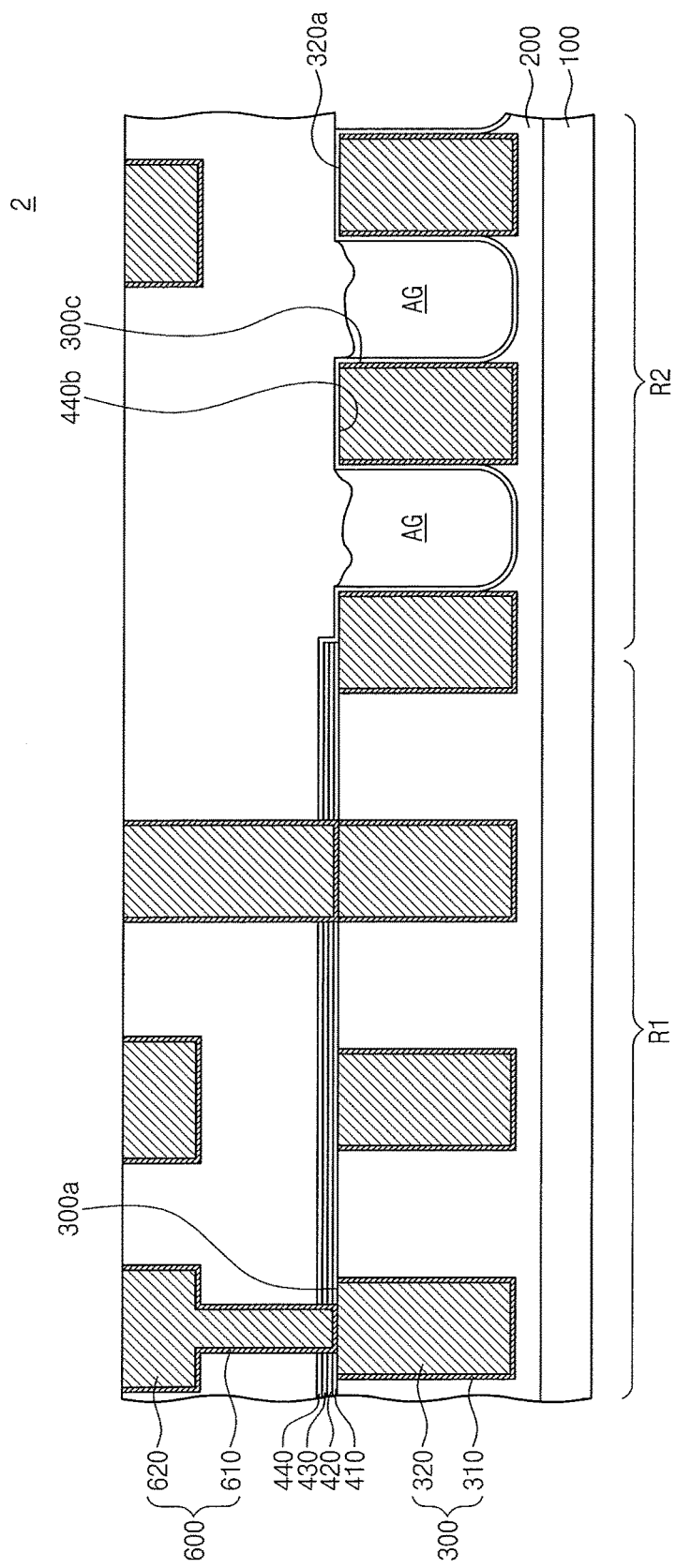
FIG. 5 is a cross-sectional view illustrating a semiconductor device according to some embodiments of the inventive concepts.

FIG. 5 is a cross-sectional view, which is taken along line I-II of FIG. 1 to illustrate a semiconductor device according to some embodiments of the inventive concepts. For concise description, a previously described element may be identified by a similar or identical reference number without repeating an overlapping description thereof.

Referring to FIG. 5 in conjunction with FIG. 1, a semiconductor device 2 may include the substrate 100, the first interlayered insulating layer 200, the first conductive patterns 300, the first to fourth insulating patterns 410, 420, 430, and 440, the second interlayered insulating layer 500, and the second conductive pattern 600. The substrate 100 may include the first and second regions R1 and R2. The air gap AG may be provided on the second region R2 of the substrate 100 and between the first conductive patterns 300.

The first to fourth insulating patterns 410, 420, 430, and 440 may be provided on the first region R1 of the substrate 100 to cover the first interlayered insulating layer 200 and the first conductive patterns 300. The first to third insulating patterns 410, 420, and 430 may not be provided on the second region R2 of the substrate 100. That is, only the fourth insulating pattern 440 may be provided in the second region R2. Each of the first to fourth insulating patterns 410, 420, 430, and 440 may be formed of or include, for example, the same materials as those described with reference to FIGS. 1 and 2. For example, the first insulating pattern 410 may be formed of or include a nitrogen-containing but oxygen-free material.

The fourth insulating pattern 440 may be extended to the second region R2 of the substrate 100 to cover the first interlayered insulating layer 200, the top surfaces 300a of the first conductive patterns 300, and side surfaces 300c of the first conductive patterns 300 of the second region R2 exposed by the recess region 220. At least a portion of the fourth insulating pattern 440 may be interposed between the air gap AG and the first interlayered insulating layer 200. The fourth insulating pattern 440 may be in physical or direct contact with the top surface 320a of the first metal pattern 320. The fourth insulating pattern 440 may be formed of or include, for example, a nitrogen-containing insulating material. For example, the fourth insulating pattern 440 may be formed of or include at least one of aluminum nitride, silicon nitride, or silicon carbonitride. The fourth insulating pattern 440 may be formed of, for example, an oxygen-free material, and, thus, the first metal pattern 320 may be prevented from being oxidized by the fourth insulating pattern 440. The fourth insulating pattern 440 may protect the first metal pattern 320 from oxygen and/or water contained in the second interlayered insulating layer 500. The fourth insulating pattern 440 may be formed to have a good step coverage property, and, thus, a void may not be formed between the first metal pattern 320 and the fourth insulating pattern 440 that are located on the second region R2 of the substrate 100. As described with reference to the first insulating pattern 410 of FIG. 4C, on the second region R2 of the substrate 100, a bottom surface 440b of the fourth insulating pattern 440 may be in contact with the top surface 320a of the first metal pattern 320 and the inner side surface 310c, of example, see FIG. 4C, of the first barrier pattern 310 exposed by the first metal pattern 320.

The semiconductor device 2 may be formed by the same or similar method as that described with reference to FIGS. 4A through 4H. For example, the method described with reference to FIG. 4B may be used to form the first and second insulating patterns 410 and 420. In some embodiments, the third insulating pattern 430 may be further formed on the second insulating pattern 420 of FIG. 4B prior to the plasma treatment process. Before the plasma treatment process of FIG. 4D, the first to third insulating patterns 410, 420, and 430 may be removed from the second region R2 of the substrate 100. The third insulating pattern 430 may be formed to expose the first interlayered insulating layer 200 on the second region R2 of the substrate 100 in the plasma treatment process. The fourth insulating pattern 440 may be formed by the same or similar method as described with reference to FIG. 4F.

Figure 6:
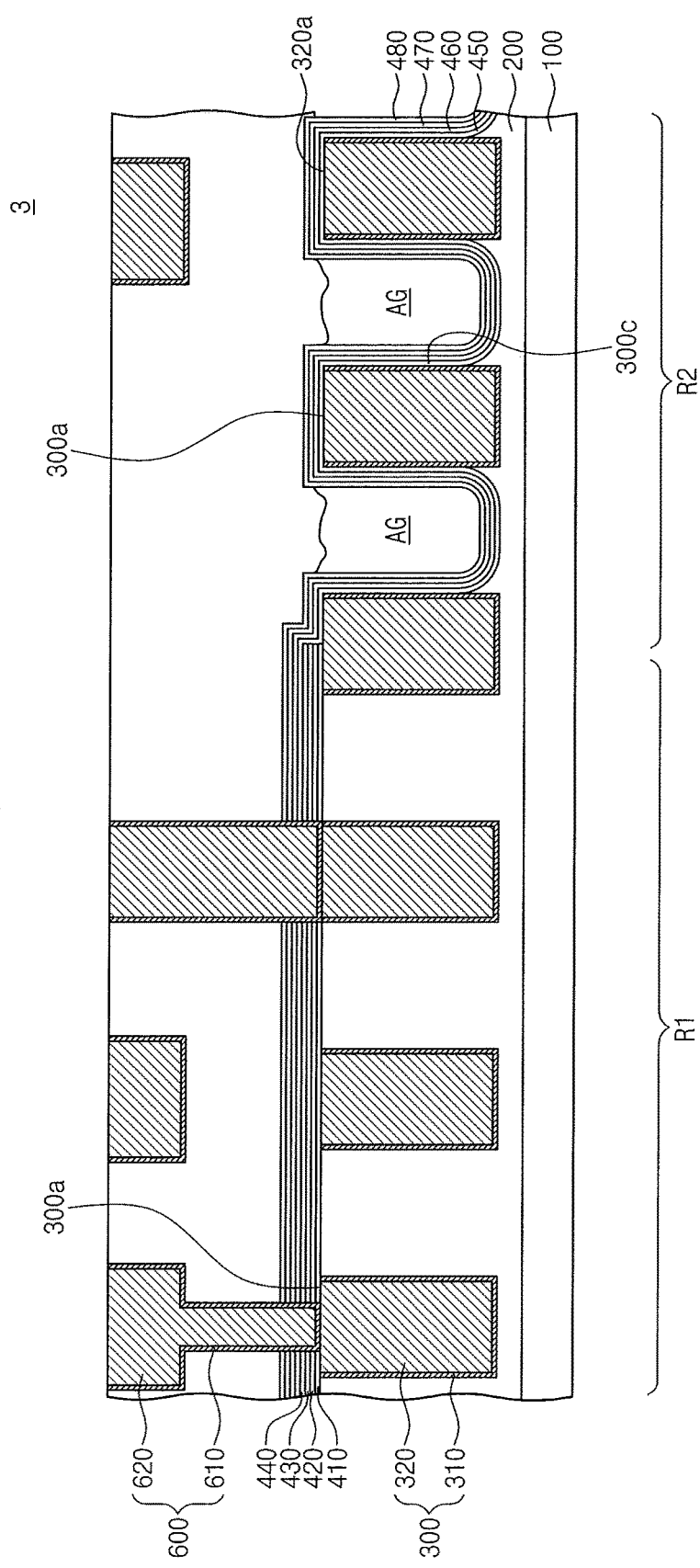
FIG. 6 is a cross-sectional view illustrating a semiconductor device according to some embodiments of the inventive concepts.

FIG. 6 is a cross-sectional view, which is taken along line I-II of FIG. 1 to illustrate a semiconductor device according to some embodiments of the inventive concepts. For concise description, a previously described element may be identified by a similar or identical reference number without repeating an overlapping description thereof.

Referring to FIG. 6 in conjunction with FIG. 1, a semiconductor device 3 may include the substrate 100 having the first and second regions R1 and R2, the first interlayered insulating layer 200, the first conductive patterns 300, a plurality of insulating patterns, for example, first to eighth insulating patterns 410, 420, 430, 440, 450, 460, 470, and 480, the second interlayered insulating layer 500, and the second conductive pattern 600. The air gap AG may be provided on the second region R2 of the substrate 100 and between the first conductive patterns 300 of the second region R2.

The first to fourth insulating patterns 410, 420, 430, and 440 may be provided on the first region R1 of the substrate 100 to cover the first interlayered insulating layer 200 and the first conductive patterns 300. All of the first to fourth insulating patterns 410, 420, 430, and 440 may not be extended to the second region R2 of the substrate 100. That is, only the fifth to eighth insulating patterns 450, 460, 470 and 480 extend to the second region R2. Each of the first to fourth insulating patterns 410, 420, 430, and 440 may be formed of or include, for example, the same materials as those described with reference to FIGS. 1 and 2.

The fifth to eighth insulating patterns 450, 460, 470 and 480 may be provided on the first region R1 to cover the fourth insulating pattern 440. In addition, the fifth to eighth insulating patterns 450, 460, 470, and 480 may be provided on the second region R2 of the substrate 100 to sequentially cover the first interlayered insulating layer 200, the top surfaces 300a of the first conductive patterns 300, and the side surfaces 300c of the first conductive patterns 300. The fifth to eighth insulating patterns 450, 460, 470, and 480 may be provided between the air gap AG and the first conductive patterns 300 adjacent thereto and between the air gap AG and the first interlayered insulating layer 200. In some embodiments, each of the fifth to eighth insulating patterns 450, 460, 470, and 480 may be formed of or include, for example, the same or similar materials as a corresponding one of the first to fourth insulating patterns 410, 420, 430, and 440. For example, the fifth insulating pattern 450 may be formed of or include at least one of aluminum nitride, silicon nitride, or silicon carbonitride. The fifth insulating pattern 450 may be formed of an oxygen-free material, and, thus, oxidation of the first metal pattern 320 may be prevented. The fifth insulating pattern 450 may be formed to have a good step coverage property, and, thus, a void may not be formed between the fifth insulating pattern 450 and the first metal pattern 320, as described with reference to the first insulating pattern 410 of FIG. 4C. The fifth to eighth insulating patterns 450, 460, 470, and 480 may protect the first metal pattern 320 from oxygen and/or water contained in the second interlayered insulating layer 500. A sum of thicknesses of the fifth to eighth insulating patterns 450, 460, 470, and 480 may range from about 1 Å to about 60 Å, in particular, from 1 Å to 45 Å.

The semiconductor device 3 may be formed by a similar method as that described in connection with FIGS. 4A to 4H. For example, the method described with reference to FIG. 4B may be used to form the first and second insulating patterns 410 and 420. In some embodiments, the third and fourth insulating patterns 430 and 440 may be further formed on the second insulating pattern 420 of FIG. 4B prior to the plasma treatment process. Before the plasma treatment process of FIG. 4D, the first to fourth insulating patterns 410, 420, 430, and 440 may be removed from the second region R2 of the substrate 100. The fourth insulating pattern 440 may prevent the first interlayered insulating layer 200 on the first region R1 of the substrate 100 from being damaged during the plasma treatment process of FIG. 4D. The fifth to eighth insulating patterns 450, 460, 470, and 480 may be formed in the same or similar manner as the third and fourth insulating patterns 430 and 440 of FIG. 4F.

Figure 7:
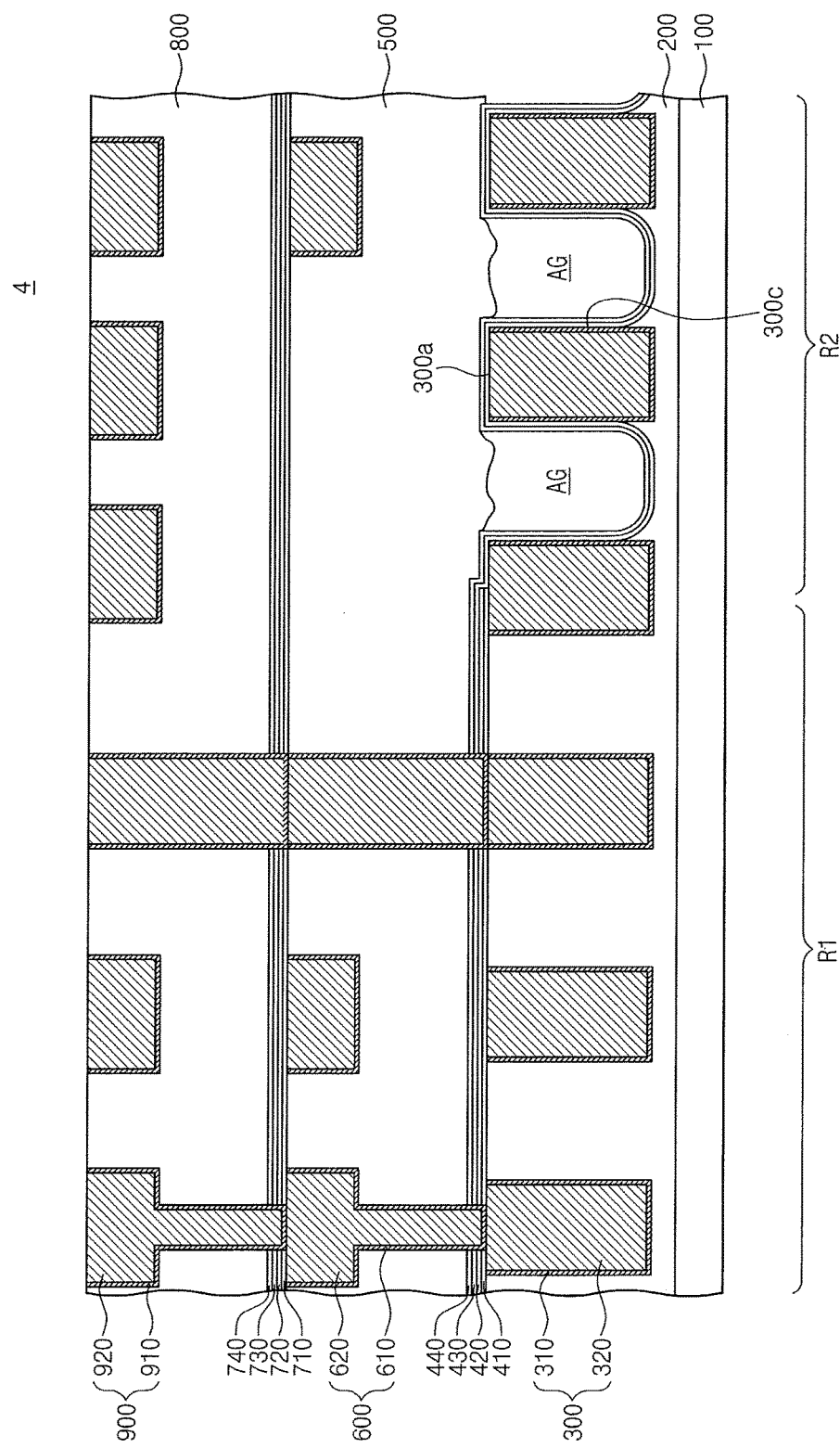
FIG. 7 is a cross-sectional view illustrating a semiconductor device according to some embodiments of the inventive concepts.

FIG. 7 is a cross-sectional view, which is taken along line I-II of FIG. 1 to illustrate a semiconductor device according to some embodiments of the inventive concepts. For concise description, a previously described element may be identified by a similar or identical reference number without repeating an overlapping description thereof.

Referring to FIG. 7 in conjunction with FIG. 1, a semiconductor device 4 may include the substrate 100 having the first and second regions R1 and R2, the first interlayered insulating layer 200, the first conductive patterns 300, the first to fourth insulating patterns 410, 420, 430, and 440, the second interlayered insulating layer 500, and the second conductive pattern 600. The air gap AG may be provided on the second region R2 of the substrate 100 and between the first conductive patterns 300 of the second region R2. The first to fourth insulating patterns 410, 420, 430, and 440 may be formed to have substantially the same features as described with reference to FIGS. 1 to 3 and may be formed by the same method as described in connection with FIGS. 4A to 4H. In some embodiments, the first to fourth insulating patterns 410, 420, 430, and 440 may be fondled to have substantially the same features as described with reference to FIG. 5 or FIG. 6.

First to fourth insulating layers 710, 720, 730, and 740 may be provided on the second interlayered insulating layer 500 and the second conductive patterns 600. A third interlayered insulating layer 800 may be provided on the fourth insulating layer 740. A third conductive pattern 900 may be provided in the third interlayered insulating layer 800. The third conductive pattern 900 may include a third barrier pattern 910 and a third metal pattern 920. The position of the third conductive pattern 900 may be changed from FIG. 7.

The first to fourth insulating layers 710, 720, 730, and 740 may be configured to prevent the second conductive pattern 600 from being damaged by water and/or oxygen contained in the third interlayered insulating layer 800. A sum of thicknesses of the first to fourth insulating layers 710, 720, 730, and 740 may range from about 1 Å to about 60 Å, in particular, from 1 Å to 45 Å. Accordingly, capacitance between the second conductive pattern 600 and the third conductive pattern 900 may be reduced and, consequently, RC delay characteristics of the semiconductor device 4 may be improved.

According to some embodiments of the inventive concept, a plurality of insulating patterns, for example, first to fourth insulating patterns, may be provided to have an interface, which makes it difficult for oxygen and/or water contained in an interlayered insulating layer to pass therethrough. That is, the first to fourth insulating patterns may prevent a metal pattern from being damaged. The first insulating pattern may be in physical contact with a top surface of the metal pattern. The first insulating pattern may be formed of an oxygen-free material, and, as a result, oxidation of the metal pattern may be prevented. A sum of thicknesses of the first to fourth insulating patterns may be relatively small. Accordingly, parasitic capacitance between the first and second conductive patterns may be reduced and, consequently, RC delay characteristics of a semiconductor device may be improved. Since a void is not formed between the first insulating pattern and the metal pattern, the semiconductor device may have improved reliability.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate having a first region and a second region;
   a first interlayered insulating layer on the substrate defining openings;
   conductive patterns in the openings defining an air gap on the second region of the substrate, the air gap being defined between the conductive patterns;
   first to fourth insulating patterns stacked on the first region of the substrate to cover the conductive patterns; and
   a second interlayered insulating layer on the fourth insulating pattern,
   wherein the fourth insulating pattern is extended to include at least a portion covering the conductive patterns on the second region.

2. The semiconductor device of claim 1, wherein the fourth insulating pattern covers top and side surfaces of the conductive patterns on the second region.

3. The semiconductor device of claim 1, wherein the first interlayered insulating layer has a recess region positioned between the conductive patterns,
   the fourth insulating pattern covers bottom and side surfaces of the recess region, and
   the air gap is in the recess region.

4. The semiconductor device of claim 1, wherein the air gap is between the fourth insulating pattern and the second interlayered insulating layer.

5. The semiconductor device of claim 1, wherein the fourth insulating pattern has a bottom surface that is lower on the second region than on the first region.

6. The semiconductor device of claim 1, wherein each of the conductive patterns comprises:

a barrier pattern on bottom and side surfaces of the openings; and a metal pattern on the barrier pattern, wherein the metal pattern comprises a first portion and a second portion, a top surface of the first portion of the metal pattern is lower than a top surface of the second portion of the metal pattern and a top surface of the barrier pattern, and the first portion is closer to a side surface of the barrier pattern, compared to the second portion.

7. The semiconductor device of claim 6, wherein the metal pattern and the first insulating pattern are in direct contact with each other in a void-free manner.

8. The semiconductor device of claim 1, wherein the third insulating pattern is extended to have at least a portion interposed between the conductive patterns and the fourth insulating pattern on the second region of the substrate.

9. The semiconductor device of claim 8, wherein the third insulating pattern is in direct contact with top surfaces of the conductive patterns on the first region, and the third insulating pattern is formed of an oxygen-free material.

10. The semiconductor device of claim 1, wherein the fourth insulating pattern is in direct contact with top surfaces of the conductive patterns on the first region, and the fourth insulating pattern is formed of an oxygen-free material.

11. The semiconductor device of claim 1, wherein the fourth insulating pattern is between the air gap and the first interlayered insulating layer.

12. A semiconductor device, comprising:

a substrate;

an interlayered insulating layer on the substrate defining an opening;

a barrier pattern on bottom and side surfaces of the opening;

a metal pattern in the opening and on the barrier pattern, the metal pattern comprising a first portion exposing an inner side surface of the barrier pattern and a second portion having a top surface higher than a top surface of the first portion; and first to fourth insulating patterns stacked directly over each other on the interlayered insulating layer and the metal pattern, wherein the first insulating pattern has a bottom surface in contact with the top surfaces of the first and second portions of the metal pattern.

13. The semiconductor device of claim 12, wherein the bottom surface of the first insulating pattern is in contact with the inner side surface of the barrier pattern.

14. The semiconductor device of claim 12, wherein the metal pattern and the first insulating pattern are in direct contact with each other in a void-free manner.

15. The semiconductor device of claim 12, wherein, when viewed in a plan view, the first portion corresponds to an edge portion of the metal pattern and the second portion corresponds to a center portion of the metal pattern.

16. The semiconductor device of claim 12, wherein the first insulating pattern is in direct contact with the top surface of the first and second portions of the metal pattern and is formed of an oxygen-free material.

17. The semiconductor device of claim 12, wherein the opening is in a first region of the substrate and wherein the interlayered insulating layer defines an air gap at a side of an opening in a second region of the substrate, and the third and fourth insulating patterns are between the interlayered insulating layer and the air gap.

18. A semiconductor device, comprising:

a substrate;

a first interlayered insulating layer on the substrate;

conductive patterns in the first interlayered insulating layer defining an air gap therebetween;

a first insulating pattern on the first interlayered insulating layer to cover top surfaces of the conductive patterns;

a second insulating pattern on the first insulating pattern;

a third insulating pattern on the second insulating pattern;

a fourth insulating pattern on the third insulating pattern; and a second interlayered insulating layer on the fourth insulating pattern, wherein the first to fourth insulating patterns are between the conductive patterns and between the first interlayered insulating layer and the air gap.

19. The semiconductor device of claim 18, wherein the air gap is between the fourth insulating pattern and the second interlayered insulating layer.

20. The semiconductor device of claim 18, wherein the first interlayered insulating layer has a recess region between the conductive patterns, the first to fourth insulating patterns are extended to cover bottom and side surfaces of the recess region, and the air gap is in the recess region.

\* \* \* \* \*